(12) United States Patent
Lin et al.

(10) Patent No.: US 6,743,075 B2
(45) Date of Patent: Jun. 1, 2004

(54) METHOD FOR DETERMINING CHEMICAL MECHANICAL POLISHING TIME

(75) Inventors: Chun-Te Lin, Hsinchu (TW); Shan-An Liu, Hsinchu (TW); Chung-Ru Wu, Hsinchu (TW); Ming-Hsien Lu, Hsinchu (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 10/346,513

(22) Filed: Jan. 15, 2003

(65) Prior Publication Data
US 2003/0186621 A1 Oct. 2, 2003

(30) Foreign Application Priority Data
Mar. 15, 2002 (TW) ........................................ 91104999 A

(51) Int. Cl.$^7$ ................................................ B24B 49/02
(52) U.S. Cl. .............................. 451/5; 451/41; 451/54; 438/11; 438/18; 438/691; 438/692
(58) Field of Search ................................. 451/5, 41, 54, 451/63; 438/691, 692, 14, 11, 18

(56) References Cited

U.S. PATENT DOCUMENTS

| | | | |
|---|---|---|---|
| 6,514,673 B2 * | 2/2003 | Lin et al. ................... | 430/317 |
| 6,517,412 B2 * | 2/2003 | Lee et al. ................... | 451/5 |
| 6,623,993 B2 * | 9/2003 | Perrin et al. ................ | 438/14 |
| 6,682,398 B2 * | 1/2004 | Meyer ........................ | 451/5 |
| 2003/0022596 A1 * | 1/2003 | Meyer ........................ | 451/5 |
| 2003/0084998 A1 * | 5/2003 | Katagiri et al. ........... | 156/345.12 |
| 2003/0224596 A1 * | 12/2003 | Marxsen et al. ............ | 438/637 |
| 2004/0023490 A1 * | 2/2004 | Wollstein et al. .......... | 438/689 |

* cited by examiner

Primary Examiner—M. Rachuba
(74) Attorney, Agent, or Firm—Townsend and Townsend and Crew LLP

(57) ABSTRACT

The present invention relates to a method for determining rapidly and accurately the polishing time of a chemical mechanical polishing process for polishing target wafers to avoid any problems of under-polishing or over-polishing. An aspect of the present invention is directed to a method for determining a chemical mechanical polishing time for removing a target polishing thickness H from an uneven surface of a target wafer. The method comprises polishing a control wafer by a chemical mechanical polishing to obtain a progressive relationship of polishing thickness and respective polishing time therefor. A first polishing time T1 is determined for removing a first thickness H1 from the target wafer, in which the first thickness H1 with substantially the uneven surface removed is smaller than the target polishing thickness H of the target wafer to be removed. In some embodiments, the first polishing time T1 is determined by polishing the target wafer to remove the first thickness H1 by chemical mechanical polishing. The method comprises calculating an image polishing thickness H1' to be removed from the control wafer with respect to the first polishing time T1 according to the progressive relationship of the polishing thickness and respective polishing time for the control wafer. A second polishing thickness H2=(H−H1) is added to the image polishing thickness H1' to obtain an equivalent polishing thickness H1' for the control wafer. A target polishing time is determined for removing the target polishing thickness H from the target wafer by interpolating the progressive relationship of the polishing thickness and respective polishing time for the control wafer based on the equivalent polishing thickness H'.

19 Claims, 3 Drawing Sheets

| Polishing time (Second) | Polishing thickness (Angstrom) |
|---|---|
| 44 | 2500 |
| 100 | 4900 |
| 150 | 6900 |
| 208 | 9100 |
| 285 | 12000 |

| Polishing time (Second) | Polishing thickness (Angstrom) |
|---|---|
| 44 | 2500 |
| 100 | 4900 |
| 150 | 6900 |
| 208 | 9100 |
| 285 | 12000 |

10K (Oxide) + 1k (Nitride) x 3 = 13K (Oxide)

METHOD FOR DETERMINING CHEMICAL MECHANICAL POLISHING TIME

CROSS-REFERENCES TO RELATED APPLICATIONS

This application claims priority from R.O.C. Patent Application No. 091104999, filed Mar. 15, 2002, the entire disclosure of which is incorporated herein by reference.

BACKGROUND OF THE INVENTION

The present invention relates to a chemical mechanical polishing process for making chips and, more particularly, to a method for determining a chemical mechanical polishing time.

In recent years, in order to reduce operation costs and improve competitiveness, almost all integrated circuit (IC) companies have devoted to increasing the packing density of integrated circuits. To achieve this goal, the dimensions of elements have to be minimized, and the intervals between elements have also to be reduced. To meet this objective, it is preferable to have every layer of IC reaching global planarization. With the help from recent development of Chemical Mechanical Polishing (CMP) technology, the goal of global planarization becomes feasible. That is, the CMP technology has become a major key to making the increase of IC packing density possible.

Referring to FIG. 1, a cross-sectional view of a typical multi-layer IC is shown embedded. In this multi-layer IC, shallow trench isolations 12 for defining active devices are formed on a semiconductor substrate 10 through a conventional standard process. On the substrate 10 in addition to the shallow trench isolations 12, metal oxide semiconductor field effect transistors (MOSFETs) are formed, in which the MOSFETs include gate dielectric layers 14, gate conductive layers 16, lightly doped sources/drains (not shown in the drawing), sources/drains 18, silicon nitride sidewall spacers 20, and silicon nitride caps 22. The gate conductive layers 16 are formed by applying photolithography and ion etching on a first polysilicon layer. The nitride sidewall spacers 20 and the nitride caps 22, with a total thickness of about 600 Å, are formed to serve as end points for a subsequent anisotropic etching process that develops self-aligned contacts. As shown, a first polysilicon inter-layer dielectric 23 is formed on the MOSFETs. A second polysilicon layer 24 developed from a polysilicon layer topping the first polysilicon inter-layer dielectric 23 is formed by applying also the photolithography and etching process. Another polysilicon layer for developing a third polysilicon layer 28 by the photolithography and etching process is provided onto a second polysilicon inter-layer dielectric 26. Typically, a total thickness of the first polysilicon inter-layer dielectric 23 and the second polysilicon inter-layer dielectric 26 is about 3,500 Å. As shown in this typical layer structure, a top inter-layer dielectric 30 on the third polysilicon layer 28 is shown to be unexpectedly deposited with an undulating surface. In particular, the wafer comprising the undulating surface of the above IC structure can be planarized with a typical CMP process.

In reworking of the CMP process, for example, to polish an initial thickness of 20,000 Å of the inter-layer dielectric 30 to about 8000 Å, an endpoint detection technique is typically used to monitor the polishing to avoid over-polishing or under-polishing. The endpoint detection technique is performed by utilizing a laser beam to project onto the inter-layer dielectric 30 and then measuring a reflection intensity of the laser beam. The reflection intensity varies because of different interference effects resulting from different thicknesses of the remaining inter-layer dielectric 30. By using the normal light intensity as the vertical coordinate and time as the horizontal coordinate, a gradient relationship between the light intensity and the time can be obtained to determine the remaining thickness of the dielectric 30, and thereby the endpoint for the CMP process can be deduced. However, because of the complication of performing the aforesaid CMP technique and the non-linearity of the polishing, precision of thickness control cannot be guaranteed and thus the polishing quality usually suffers.

Still, there are other useful methods similar to the endpoint detection techniques. One approach is to form a pattern on the surface of a test wafer having the same thickness as the real wafer to be polished. The CMP process on the test wafer follows a trial-and-error manner that provides a shorter initial polishing time with gradually increasing polishing times thereafter. The initial shorter polishing time is preset to result in an insufficient polishing. Then, the polishing time is gradually increased until the polishing thickness meets certain preset requirements. The polishing time elapsed is then used as the endpoint time for the CMP process. However, such a method needs a lot of polishing tests and is both time-consuming and material-wasting. Furthermore, such a processing reduces the service life of the polishing machine. Yet, producing the pattern on the testing wafer surface takes a lot of time, and it is possible that the results inaccurately reflect the actual polishing conditions. Such an approach may also result in over-polishing or under-polishing.

Therefore, to develop a method for determining polishing time for CMP process is an important task in the IC industry.

BRIEF SUMMARY OF THE INVENTION

The present invention relates to a method for determining rapidly and accurately the polishing time of a chemical mechanical polishing process for polishing target wafers to avoid any problems of under-polishing or over-polishing. The method does so by polishing a control wafer to produce a progressive relationship of polishing thickness and respective polishing time thereof. Through an equivalent conversion approach, the method converts a polishing thickness of the target wafer into a corresponding or equivalent polishing thickness of the control wafer. Based on the progressive relationship for the control wafer, a polishing time for the target wafer is determined from the equivalent polishing thickness of the control wafer.

An aspect of the present invention is directed to a method for determining a chemical mechanical polishing time for removing a target polishing thickness H from an uneven surface of a target wafer. The method comprises polishing a control wafer by a chemical mechanical polishing to obtain a progressive relationship of polishing thickness and respective polishing time therefor. A first polishing time T1 is determined for removing a first thickness H1 from the target wafer, in which the first thickness H1 with substantially the uneven surface removed is smaller than the target polishing thickness H of the target wafer to be removed. In some embodiments, the first polishing time T1 is determined by polishing the target wafer to remove the first thickness H1 by chemical mechanical polishing. The method comprises calculating an image polishing thickness H1' to be removed from the control wafer with respect to the first polishing time T1 according to the progressive relationship of the polishing thickness and respective polishing time for the control wafer. A second polishing thickness H2=(H−H1) is added to the image polishing thickness H1' to obtain an equivalent polishing thickness H' for the control wafer. A target polishing time is determined for removing the target polishing thickness H from the target wafer by interpolating the progressive relationship of the polishing thickness and respective polishing time for the control wafer based on the equivalent polishing thickness H'.

In some embodiments, the target wafer and the control wafer have the same polishing materials. In other embodiments, the target wafer and the control wafer have different polishing materials, and the method comprises converting a removal of the polishing material of the target wafer, through an equivalent conversion principle, to a corresponding removal of the polishing material of the control wafer in the same polishing time. The equivalent conversion principle converts a removal of materials of different polishing rates to a removal of materials of the same polishing rate.

In specific embodiments, the first polishing time T1 is determined by a time for removing a thickness H1=½ H from the control wafer according to the progressive relationship of polishing thickness and respective polishing time for the control wafer. The polishing material for the target wafer is selected from the group consisting of oxide, nitride and metal. The polishing material for the control wafer may also be selected from the group consisting of oxide, nitride and metal. Polishing the control wafer comprises polishing a generally even surface of the control wafer. The target wafer with the target polishing thickness H removed is substantially identical to the control wafer with the equivalent polishing thickness removed.

As the polishing rate for the target wafer is generally higher than that for the control wafer due to the effect of the uneven surface of the target wafer, it is prudent to polish the target wafer with a polishing time that is equivalent to removing less than the target polishing thickness H from the control wafer (e.g., about ½ H). As long as the uneven surface of the target wafer is substantially removed, polishing of the target wafer for the remaining thickness H2 can be seen as polishing the control wafer of the same thickness H2. By applying equivalent conversion principle to convert polishing of the target wafer to polishing of the control wafer, removing the target polishing thickness (H=H1+H2) from the target wafer is equivalent to removing the image polishing thickness (H'=H1'+H2) from the control wafer. Hence, based on the progressive relationship of polishing thickness and respective polishing time for the control wafer, the target polishing time for target wafers for removing the target polishing thickness H may be derived.

Of course, the aforesaid results are obtained only if the control wafer and the target wafer have the same type of polishing materials. For polishing different materials or multilayer materials, suitable equivalent conversions will need be performed in advance to convert polishing time for different materials into polishing time for the same material. Then, calculations according to the method of the present invention may be adopted to determine the CMP process time, and thus the expected results based on the calculations may be closer to actual polishing results.

The foregoing, as well as additional objects, features and advantages of the invention will be more readily apparent from the following detailed description, which proceeds with reference to the accompanying drawings.

DETAILED DESCRIPTION OF THE INVENTION

Figures 1, 2:
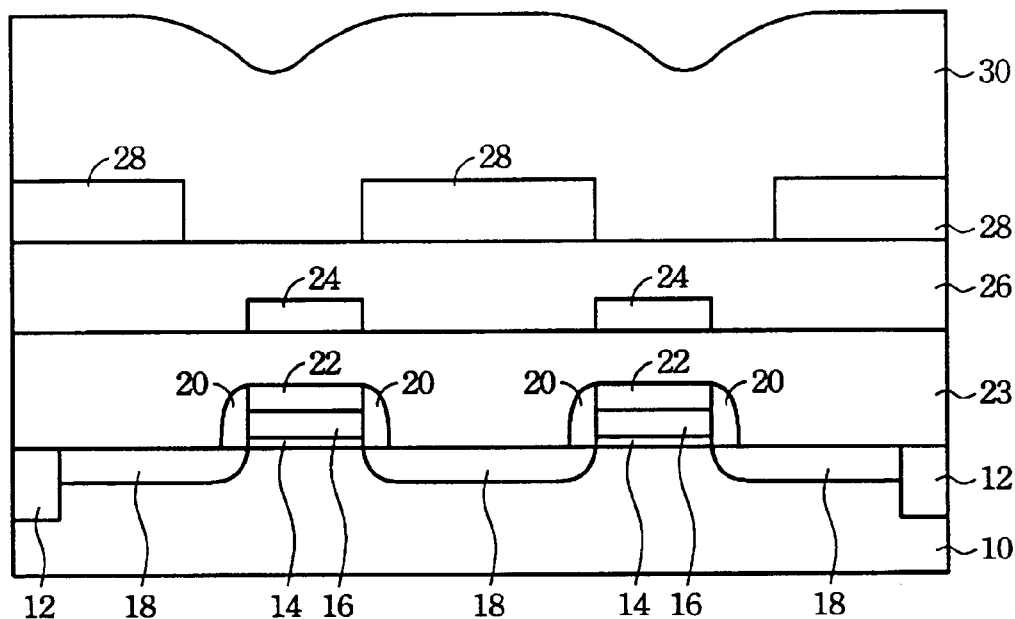
FIG. 1 is a schematic cross-sectional view of a typical multi-layer IC from a wafer to be polished.
FIG. 2 is a typical progressive relationship of polishing thickness and respective polishing time for a control wafer.

The present invention is directed to providing a method for determining chemical mechanical polishing time that, through an equivalent conversion approach, converts a polishing thickness of a target wafer into a corresponding or equivalent polishing thickness of a control wafer. Based on the progressive relationship of the polishing thickness and respective polishing time of the control wafer, the present method determines the polishing time required for removing a selected polishing thickness for the target wafer. The present method may be adapted for polishing nitride or metal as well as for polishing oxide materials.

Before discussing the details, it is essential to have a clear understanding upon two basic concepts and the difference between the control wafer and the target wafer adopted in the invention:

1. The control wafer, as used herein, refers to a wafer having a surface deposited with a layer of film. The material of the control wafer is preferably the same as the material of the target wafer which has a surface with material to be removed by polishing. However, the materials can be different. The film on the control wafer is not required to be exposed through photo masks to form patterns. Yet, the control wafer is still different from a bare wafer that does not have the film formed thereon.

2. When an uneven surface of the target wafer has been removed by polishing, the remaining polishing process can then be the same as the polishing process for the control wafer in the present invention. Hence, the polishing time required to remove the same thickness of the target wafer and the control wafer is about the same.

3. During the CMP process, the polishing speed differs for different materials. An equivalent conversion principle may be employed to convert the polishing parameters (e.g., polishing time or polishing thickness) of different materials to those of the same material. For instance, the ratio between the polishing speeds for a typical oxide and a typical nitride is about 3:1. In the case of polishing the oxide and the nitride in the same duration of time, the thickness of the oxide removed is about three times as much as that of the nitride. Hence, based on a proper equivalent conversion principle, a nitride with a thickness is equivalent to an oxide with three times of that thickness.

An embodiment of the present invention is directed to a method for determining chemical mechanical polishing time to remove a target polishing thickness H of a target wafer that has an uneven surface. The method includes polishing a control wafer having a film without patterns formed thereon by a chemical mechanical polishing and recording a progressive relationship of polishing thickness and respective polishing time therefor. The target wafer is polished by another chemical mechanical polishing to remove a first thickness H1 in a first polishing time T1, in which the first thickness H1 with substantially the uneven surface removed is smaller than an actual thickness H of the target wafer expected to be removed so as to equip the target wafer with properties of the control wafer. The method projects an image polishing thickness H1' to be removed on the control wafer with respect to the first polishing time T1 according to the progressive relationship of polishing thickness and respective polishing time. A second polishing thickness H2=(H−H1) is added to the image polishing thickness H1' to obtain an equivalent polishing thickness H' for the control wafer. The method determines a target polishing time for removing the target polishing thickness H from the target wafer by interpolating the progressive relationship of polishing thickness and respective polishing time based on the equivalent polishing thickness H'.

Figure 3:
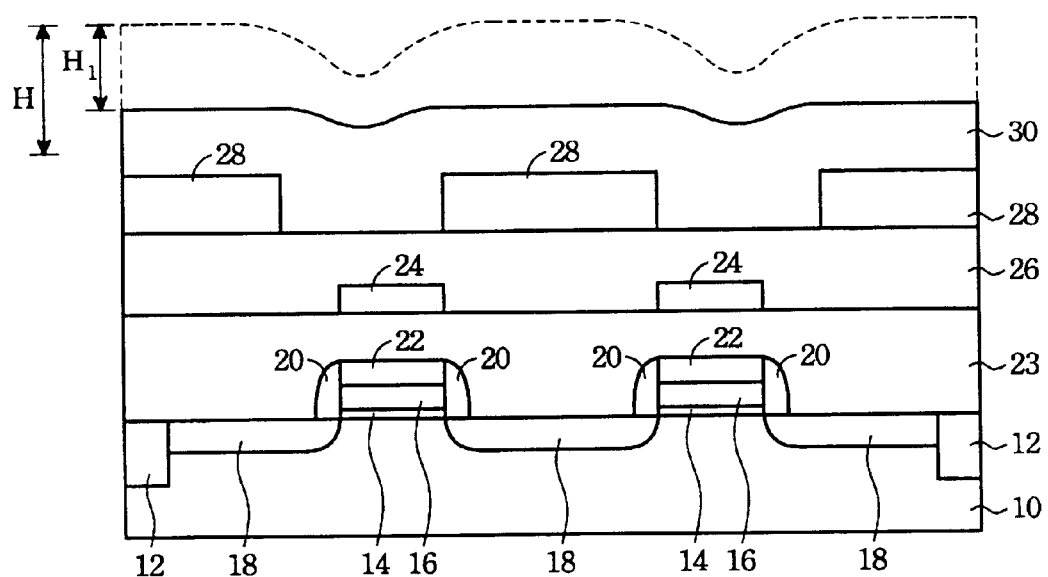
FIG. 3 is a schematic cross-sectional view of a typical multi-layer IC from a target wafer by removing a first polishing thickness H1.
Figure 4:
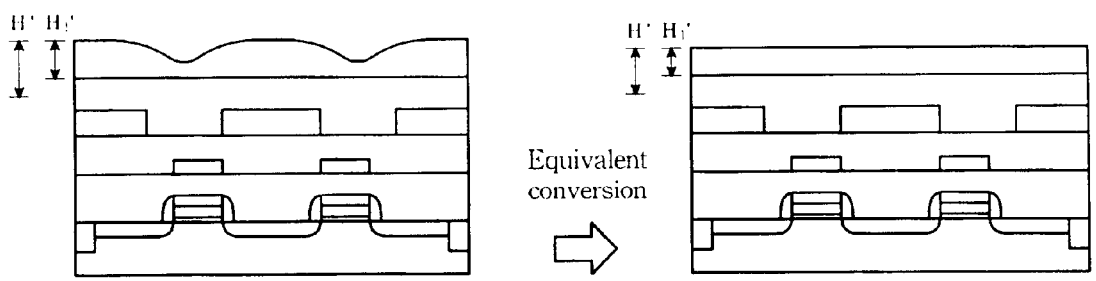
FIG. 4 is a schematic cross-sectional view of converting the IC of FIG. 3 to that of a control wafer by applying an equivalent conversion principle.

The following example is based on aforesaid basic concepts by adopting the CMP process to polish a dielectric layer of 20,000 Å on a target wafer to 8,000 Å. To determine the polishing time, the first step is to employ a CMP process to polish a control wafer, and record the progressive relationship of the polishing thickness and the respective polishing time for the control wafer (typically, as shown in FIG. 2 for a specific example). Then, the same polishing process as performed on the control wafer is employed to polish the target wafer by removing a first polishing thickness H1 (e.g., 9,500 Å), with a first polishing time T1 (143 seconds), in which H1 (9,500 Å) is smaller than the target polishing thickness H (12,000 Å) for the target wafer. Also, it is noted that the first polishing thickness H1 is sufficiently large to substantially remove the uneven surface of the target wafer, as shown in FIG. 3. By projecting or interpolating the progressive relationship provided in FIG. 2, an image polishing thickness H1' (6,600 Å) is found for the thickness of the control wafer to be removed in the same polishing time T1 (143 seconds). Thus, after the equivalent conversion, the polishing time for the first polishing thickness H1 (9,500 Å) of the target wafer is about the same as the polishing time for the image polishing thickness H1' (6,600 Å) of the control wafer (as shown in FIG. 4). At this stage, the thickness of the target wafer to be further removed is a second polishing thickness H2=(H−H1)=(2,500 Å), and this thickness H2 now can be seen as a thickness to be removed from the control wafer, since almost all the uneven surface on the target wafer is removed in the first polishing. Therefore, for the target wafer to be polished and planarized as for the control wafer, the equivalent polishing thickness H'=(H2+H1')=(9,100 Å) of the control wafer corresponding to the target polishing thickness H (12,000 Å) of the target wafer is obtained. Finally, referring back to FIG. 2 for the progressive relationship of the polishing thickness and the respective polishing time for the control wafer, the equivalent polishing thickness H' (9,100 Å) of the control wafer that has been converted from the target polishing thickness H (12,000 Å) of the target wafer is used to determine a time T=208 seconds required for removing the target polishing thickness H (12,000 Å) from the target wafer.

As the polishing time for the target wafer is generally shorter than that for the control wafer due to the factor of the uneven surface, to polish the target wafer with the first polishing time T1 equal to removing ½ H of the control wafer from the progressive relationship is believed to remove the first polishing thickness H1 of the target wafer substantially exceeding the region of the uneven surface of the target wafer. Based on the progressive relationship shown in FIG. 2, it can be determined that the first polishing time T1 is 143 seconds. Of course, any other value can also be selected for T1 as long as the first polishing thickness H1 conforms to the requirement of removing the uneven surface of the target wafer in accordance with the present invention. Particularly, when the uneven surface of the target wafer is removed, polishing for the remaining second polishing thickness H2 of the target wafer may be seen as polishing for the same thickness of the control wafer. When adopting the equivalent conversion principle to convert polishing of the target wafer into polishing of the control wafer, the target polishing thickness H (H=H1+H2) of the target wafer is equivalent to the equivalent polishing thickness H' (H'=H1'+H2) of the control wafer. Hence, by interpolating the equivalent polishing thickness H' on the progressive relationship between the polishing thickness and the respective polishing time for the control wafer, the actual polishing time for removing the target polishing thickness H on the target wafer can then be determined.

Figure 5:
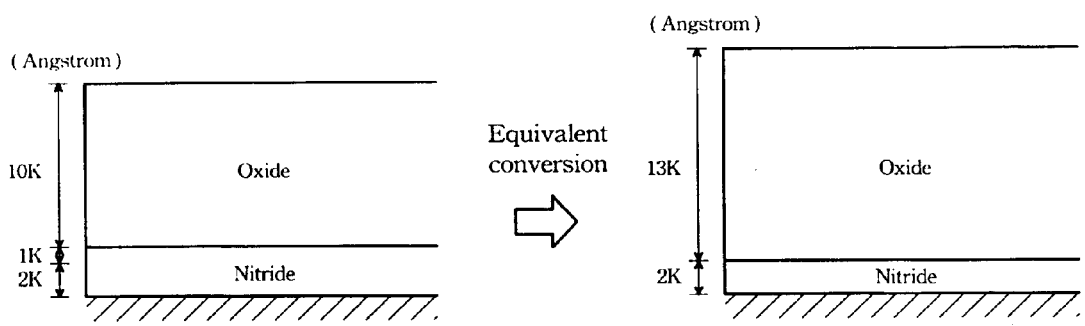
FIG. 5 is a schematic view of a typical equivalent conversion between different materials.

When adopting the method of the present invention to determine the polishing time for multi-layer wafers made from different materials, it is preferable to convert different materials into the same material according to the equivalent conversion principle. Then, the required polishing time for a CMP process may be calculated and obtained according to the present invention. For instance, when to polish an oxide with a thickness of 10,000 Å and a nitride with a thickness of 1,000 Å, the nitride may be converted to the oxide according to the equivalent conversion principle, and total polishing thickness may be treated as polishing an oxide with the thickness of 13,000 Å in the same amount of polishing time, as shown in FIG. 5.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A method for determining a chemical mechanical polishing time for removing a target polishing thickness H from an uneven surface of a target wafer, the method comprising:

polishing a control wafer by a chemical mechanical polishing to obtain a progressive relationship of polishing thickness and respective polishing time therefor;

polishing the target wafer by another chemical mechanical polishing to remove a first thickness H1 in a first polishing time T1, in which the first thickness H1 with substantially the uneven surface removed is smaller than the target polishing thickness H of the target wafer to be removed;

calculating an image polishing thickness H1' to be removed from the control wafer with respect to the first polishing time T1 according to the progressive relationship of the polishing thickness and respective polishing time for the control wafer;

adding a second polishing thickness H2=(H−H1) to the image polishing thickness H1' to obtain an equivalent polishing thickness H' for the control wafer; and determining a target polishing time for removing the target polishing thickness H from the target wafer by interpolating the progressive relationship of the polishing thickness and respective polishing time for the control wafer based on the equivalent polishing thickness H'.

2. The method of claim 1, wherein said target wafer and said control wafer have the same polishing materials.

3. The method of claim 1, wherein said target wafer and said control wafer have different polishing materials, and further comprising converting a removal of the polishing material of said target wafer, through an equivalent conversion principle, to a corresponding removal of the polishing material of said control wafer in the same polishing time.

4. The method of claim 3, wherein said equivalent conversion principle converts a removal of materials of different polishing rates to a removal of materials of a same polishing rate.

5. The method of claim 1, wherein said first polishing time T1 is determined by a time for removing a thickness H1=½ H from said control wafer according to said progressive relationship of polishing thickness and respective polishing time for the control wafer.

6. The method of claim 1, wherein a polishing material for said target wafer is selected from the group consisting of oxide, nitride and metal.

7. The method of claim 1, wherein a polishing material for said control wafer is selected from the group consisting of oxide, nitride and metal.

8. The method of claim 1, wherein polishing said control wafer comprises polishing a generally even surface of said control wafer.

9. The method of claim 1, wherein said target wafer with the target polishing thickness H removed is substantially identical to said control wafer with the equivalent polishing thickness H' removed.

10. A method for determining a chemical mechanical polishing time for removing a target polishing thickness H from an uneven surface of a target wafer, the method comprising:

polishing a control wafer by a chemical mechanical polishing to obtain a progressive relationship of polishing thickness and respective polishing time therefor;

determining a first polishing time T1 for removing a first thickness H1 from the target wafer, in which the first thickness H1 with substantially the uneven surface removed is smaller than the target polishing thickness H of the target wafer to be removed;

calculating an image polishing thickness H1' to be removed from the control wafer with respect to the first polishing time T1 according to the progressive relationship of the polishing thickness and respective polishing time for the control wafer;

adding a second polishing thickness H2=(H−H1) to the image polishing thickness H1' to obtain an equivalent polishing thickness H' for the control wafer; and determining a target polishing time for removing the target polishing thickness H from the target wafer by interpolating the progressive relationship of the polishing thickness and respective polishing time for the control wafer based on the equivalent polishing thickness H'.

11. The method of claim 10, wherein said first polishing time T1 is determined by polishing the target wafer to remove the first thickness H1 by chemical mechanical polishing.

12. The method of claim 10, wherein said target wafer and said control wafer have the same polishing materials.

13. The method of claim 10, wherein said target wafer and said control wafer have different polishing materials, and further comprising converting a removal of the polishing material of said target wafer, through an equivalent conversion principle, to a corresponding removal of the polishing material of said control wafer in the same polishing time.

14. The method of claim 13, wherein said equivalent conversion principle converts a removal of materials of different polishing rates to a removal of materials of a same polishing rate.

15. The method of claim 10, wherein said first polishing time T1 is determined by a time for removing a thickness H1=½ H from said control wafer according to said progressive relationship of polishing thickness and respective polishing time for the control wafer.

16. The method of claim 10, wherein a polishing material for said target wafer is selected from the group consisting of oxide, nitride and metal.

17. The method of claim 10, wherein a polishing material for said control wafer is selected from the group consisting of oxide, nitride and metal.

18. The method of claim 10, wherein polishing said control wafer comprises polishing a generally even surface of said control wafer.

19. The method of claim 10, wherein said target wafer with the target polishing thickness H removed is substantially identical to said control wafer with the equivalent polishing thickness removed.

* * * * *